United States Patent [19]

Tews et al.

[11] Patent Number: 5,274,266
[45] Date of Patent: Dec. 28, 1993

[54] PERMEABLE BASE TRANSISTOR HAVING SELECTIVELY GROWN EMITTER

[75] Inventors: Helmut Tews, Unterhaching; Hans-Peter Zwicknagl, Stuttgart, both of Fed. Rep. of Germany

[73] Assignee: Siemens Aktiengesellschaft, Munich, Fed. Rep. of Germany

[21] Appl. No.: 15,040

[22] Filed: Feb. 8, 1993

Related U.S. Application Data

[63] Continuation of Ser. No. 750,073, Aug. 26, 1991, abandoned.

[30] Foreign Application Priority Data

Sep. 19, 1990 [DE] Fed. Rep. of Germany ....... 4029682

[51] Int. Cl.$^5$ .............................................. H01L 29/72
[52] U.S. Cl. .................... 257/592; 257/197; 257/198
[58] Field of Search ................. 357/22; 257/592, 197, 257/198

[56] References Cited

U.S. PATENT DOCUMENTS

| | | | |
|---|---|---|---|
| 4,712,122 | 12/1987 | Nishizawa et al. | 357/22 |
| 4,901,121 | 2/1990 | Gibson et al. | 357/22 |

OTHER PUBLICATIONS

Surface Science 174 (1986), "Current Prospects for the Permeable Base Transistor" by Carl O. Bozler, pp. 487-500.

IEEE Transactions on Electron Devices, vol. ED-34, No. 8, Aug., 1987 "Ion-Sensing Devices with Silicon Nitride and Borosilicate Glass Insulators", by David L. Harame et al, pp. 1700-1707.

Microwave Journal, Jul., 1987 "Performance and Producibility of the GaAs Permeable Base Transistor," by R. Allen Murphy and James D. Murphy, pp. 101-116.

SPIE vol. 797, Advanced Processing of Semiconductor Devices (1987), Advances in the Technology for the Permeable Base Transistor, by M. A. Hollis et al, pp. 335-347.

*Primary Examiner*—Edward Wojciechowicz
*Attorney, Agent, or Firm*—Hill, Steadman & Simpson

[57] ABSTRACT

A permeable base transistor has an emitter layer or emitter layer sequence composed of a semiconductor material which has a greater energy band gap than a semiconductor material of a base layer. This emitter layer or emitter layer sequence is selectively grown into an opening of the base layer and onto a collector layer situated therebelow.

8 Claims, 3 Drawing Sheets

PERMEABLE BASE TRANSISTOR HAVING SELECTIVELY GROWN EMITTER

This is a continuation of application Ser. No. 750,073, filed Aug. 26, 1991, now abandoned.

BACKGROUND OF THE INVENTION

The present invention is directed to a permeable base transistor for applications in the microwave field.

A permeable base transistor, for example, is described in the article by R. A. Murphy and J. D. Murphy, "Performance and Producibility of the GaAs Permeable Base Transistor" in Microwave Journal, July 1987, pages 101 through 116, incorporated herein. In such a permeable base transistor, a grid-shaped base of tungsten is embedded in a collector layer of GaAs. This collector layer is limited by high-impedance GaAs material to the side of the base grid in order to limit the flow of current from a surface-wide emitter layer onto the area occupied by the base grid. When a potential is applied, the flow of current through the collector is controlled by the grid. Technological processes for the manufacture of such transistors are described in the publication by M. A. Hollis et al, "Advances in the Technology for the Permeable Base Transistor," in SPIE, Vol. 797, pages 335 through 347, incorporated herein. Another overview article is that of C. O. Bozler, "Current Prospects for the Permeable Base Transistor," in surface Science 174, 487–500 (1986), incorporated herein.

In vertical channel field effect transistors, the vertical flow of current in the semiconductor material is controlled by metal gates laterally applied around the channel at both sides. Care must thereby be exercised to see that no electrical contacts exist between the semiconductor material and the metal electrodes of the gate.

SUMMARY OF THE INVENTION

It is an object of the present invention to specify an easily manufactured permeable base transistor for application in the microwave area.

This object is achieved with a permeable base transistor comprising a semiconductor substrate. Grown on top of the semiconductor substrate is a sub-collector layer, a collector layer grown on the sub-collector layer, a base layer grown on the collector layer, and an emitter layer grown onto the collector layer within an opening of the base layer. The emitter layer comprises a semiconductor material which has a greater energy band gap than does semiconductor material of the base layer. A base metallization is provided on the base layer and an emitter metallization is provided on the emitter layer which is electrically insulated from the base metallization. A collector metallization is provided on the sub-collector layer.

DESCRIPTION OF THE PREFERRED EMBODIMENTS

In the permeable base transistor of the invention, the base, like the other layers, is of semiconductor material. The emitter layer is grown by selective epitaxy into one or more structured openings of the base layer. In this transistor, either the entire emitter layer or at least the portions of an emitter layer sequence grown first in the opening of the base layer is formed of a semiconductor material which has a greater energy band gap in comparison to the semiconductor material of the base. The heterojunction between the base layer and the emitter layer suppresses an injection of charge carriers from the base into the emitter region analogous to the heterobipolar transistor when a potential is applied to the base. The conductive emitter channel is alternately constricted or opened by applying an AC voltage to the base. The functioning of this transistor is therefore comparable to that of a vertical FET.

Figure 1:
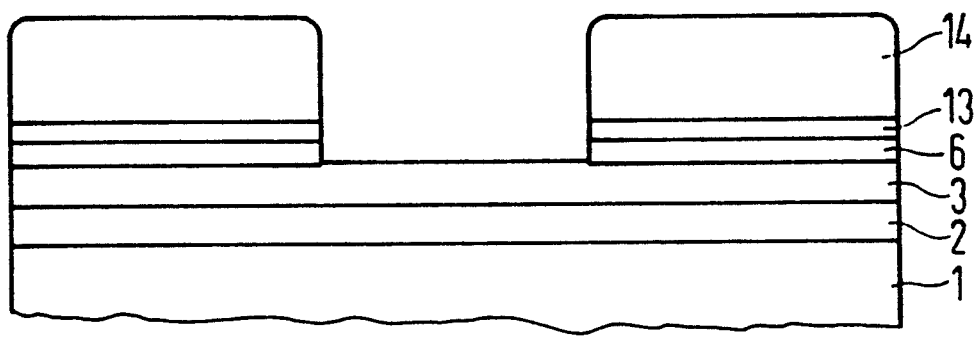
FIGS. 1 through 5 show the transistor of the invention in cross section after five different steps of the manufacturing method.
Figure 2:
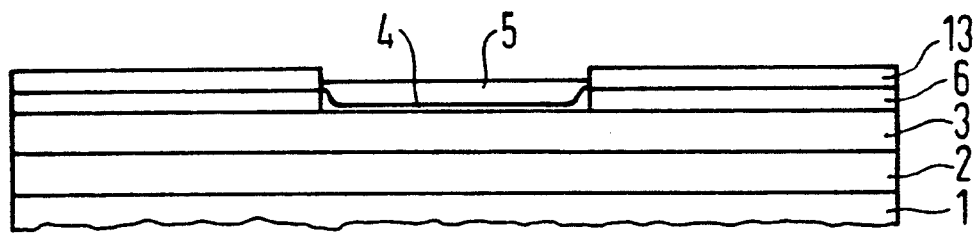

The manufacture of an exemplary embodiment shall be set forth below with reference to FIGS. 1 through 5. In a first epitaxial process (for example, MBE, MOVPE, MO-MBE), a sub-collector layer 2, a collector layer 3, and a base layer 6 are grown onto a substrate 1 in a way corresponding to the prior art. An insulator layer 13 (for example, $Si_3N_4$ or an oxide) is applied surface-wide onto the base layer 6 and, together with the base layer 6 situated therebelow, is structured wet-chemically or, respectively, dry-chemically with a photoresist mask 14 (FIG. 1). The maximum sizes of the openings in the base layer depend on the selection of the doping intensity in the emitter layer to be subsequently grown on. After the removal of the photoresist mask 14 and the cleaning of the exposed semiconductor surface of the collector layer 3 in the openings of the base layer 6, the emitter layer 4, 5 is then selectively grown with, for example, MOVPE into the opening of the base layer 6 (FIG. 2).

Figure 3:
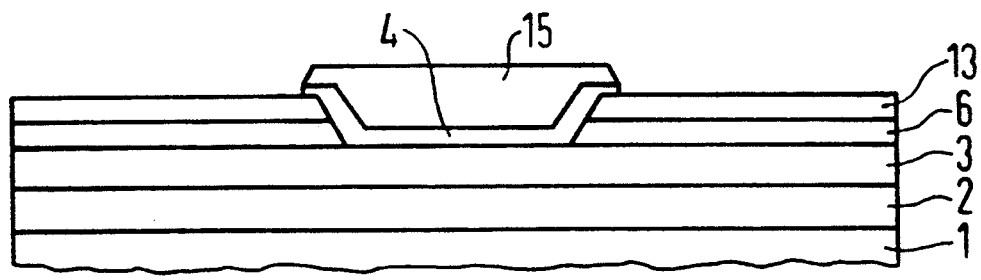

The sidewalls of the openings in the base layer can proceed vertically or at an angle. FIG. 2 shows the case of vertical sidewalls and FIG. 3 shows the case of slanting sidewalls. In FIG. 3, the emitter layer sequence 4, 5 is grown extending beyond the edge of the insulator layer 13.

The emitter layer 4, 5 can be composed of a layer sequence of a plurality of individual layers, for example of an extremely thin layer 4 which is grown directly onto the collector layer 3 that has a thickness of a few nm with an energy band gap that is far, far higher compared to the material of the base layer 6 (for example, GaAs for the base layer 6 and AlAs for this first emitter layer 4); and can be further composed of a further layer 5 next grown thereonto and composed of a material having a better conductivity (for example, GaAs). A cover layer 15 having higher doping can be subsequently grown onto the emitter layer 4 or, respectively, onto the emitter layer sequence 4, 5 to produce a good metal-to-semiconductor contact (see FIG. 3).

After this selective epitaxy, the insulator layer 13 still initially remains on the surface of the semiconductor material as a passivation layer. The emitter metallization 8 is applied with a phototechnique. If the base metallization is to be applied in self-aligned fashion vis-a-vis the emitter metallization, it is advantageous when the emitter metallization 8 overlaps the insulator layer 13 by a few tenths of a $\mu m$ at both sides. The insulator layer 13 is then removed either surface-wide down to a passivation layer 20 under the emitter metallization 8 or at least selectively in the region that is provided for the base contact (structuring with a photoresist mask).

Figure 4:
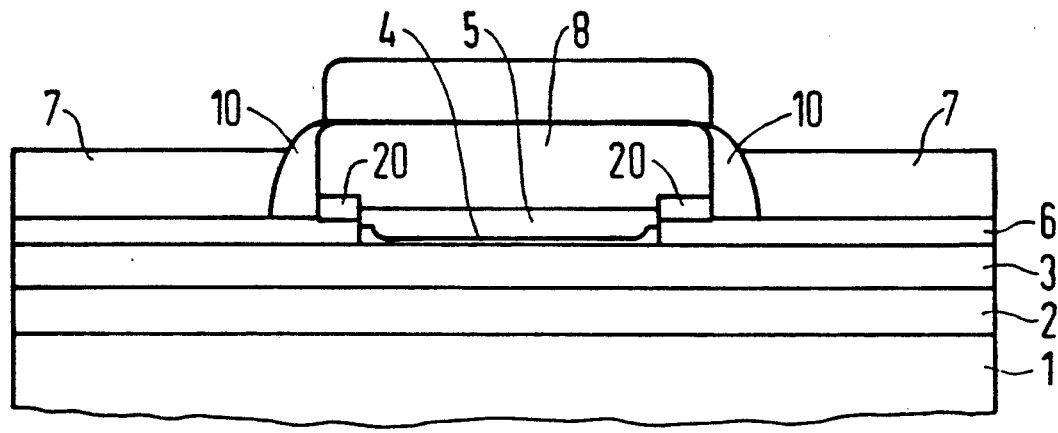
Figure 5:
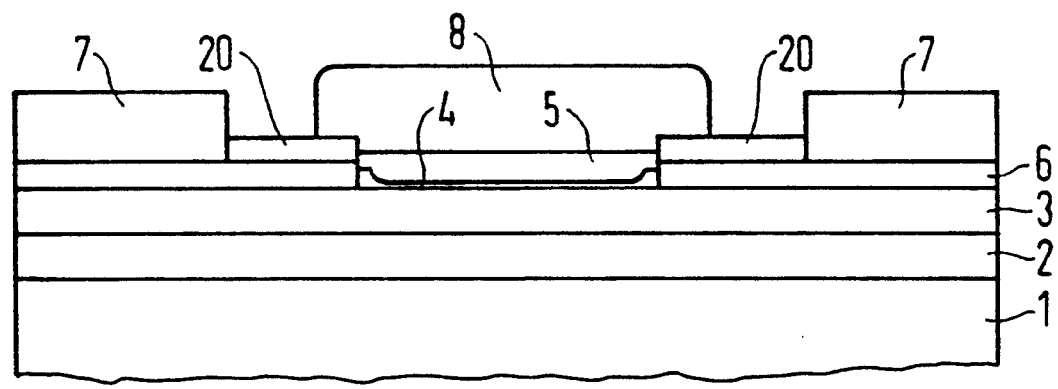

In the case of a self-aligned emitter-base region, a spacer 10 is produced at both sides of the emitter metallization 8 by, for example, surface-wide application of a further passivation layer and the re-etching thereof. The base metallization 7 is subsequently applied. Such a self-aligned structuring of the emitter-base region is shown in FIG. 4. An alternative embodiment without the spacer is shown in FIG. 5. In FIG. 5, the passivation layer 20 has been extended laterally farther up to the base metallization 7.

Figure 6:
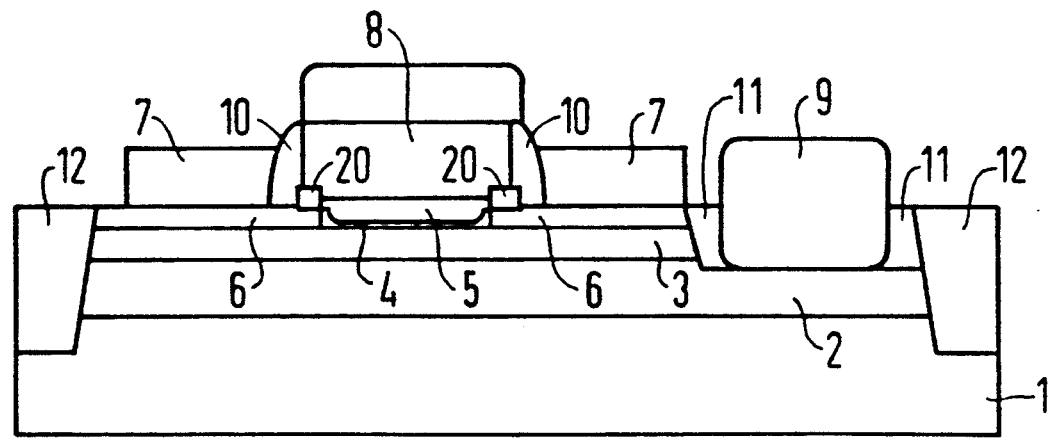
FIG. 6 shows an exemplary embodiment of the transistor of the invention in cross section.

Outside of the emitter-base region, the collector layer 3 and the base layer 6 are etched out extending at least to the sub-collector layer 2. The collector metallization 9 is applied on the sub-collector layer 2 in this region. The remaining openings between the collector metallization 9 and the laterally adjoining semiconductor material are filled up with electrically insulating material to form insulation regions 11. The electrical connections of the metallizations (wiring, interconnects) are executed in a known way. In the exemplary embodiment of FIG. 6, the transistor is additionally laterally limited by separating trenches 12 that extend down into the substrate 1 and may be potentially filled with insulating material.

The manufacture of the emitter with selective epitaxy in the openings of the base layer 6 is not limited to a specific system of materials. Typical combinations of materials that can be employed for the transistor of the invention are, for example:

| Base | Emitter |
| --- | --- |
| p+-GaAs | N−-AlAs/N+-AlGaAs |
| | N−-AlAs/N-AlGaAs/n+-GaAs |
| | N−-AlAs/n-GaAs/n+-GaAs |
| | N−-AlAs/n-GaAs/n+-grad.InGaAs/InGaAs |
| | N−AlGaAs/n+-GaAs |
| | N−-AlGaAs/n−-GaAs/n+GaAs |
| | N−AlGaAs/n+-GaAs/n+-grad.InGaAs/InGaAs |
| p+-InGaAs | n−-InP/n+ = InP |
| p+-Ge | N-GaAs |
| p+-SiGe | n-Si/n+Si |

However, other modifications of III-V heterobipolar epilayer sequences can also be employed.

Figure 7:
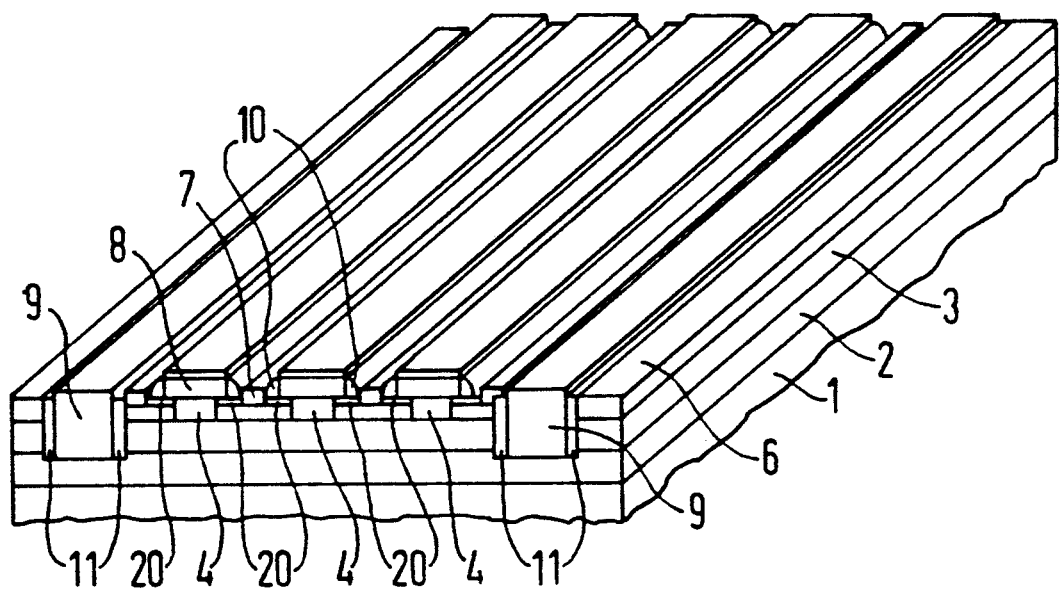
FIG. 7 shows an alternative exemplary embodiment of the transistor of the invention in a sectional plan view.

FIG. 7 shows a sectional plan view of an exemplary embodiment of a permeable base transistor of the invention comprising three strip-shaped portions of the emitter layer 4 grown into the base layer 6. The reference layers correspond to those of FIG. 6.

In comparison to a conventional heterobipolar transistor having the same emitter area (for example 5 $\mu m^2$), the base-emitter area given a respective base layer thickness or emitter layer thickness of 0.1 $\mu m$ is lowered to 1.2 $\mu m^2$ in a transistor of the invention. The base-emitter capacitance in the structure of the invention is correspondingly reduced.

Given what is otherwise an identical layer structure and layout, a transistor of the invention is superior to the conventional heterobipolar transistor with respect to high-frequency properties (shorter transit time), and above all given low currents as well.

The transistor of the invention also has advantages in view of higher transistor current gain. Since the emitter layer 4, 5 lies embedded into the base layer 6, the area for a surface recombination is drastically reduced in combination with a heterobipolar transistor having the standard structure. Since the injection of charge carriers from the base into the emitter channel is greatly suppressed due to the heterojunction at the boundary surface between base and emitter, the probability of a recombination of charge carriers in the emitter when traversing the emitter channel proceeding within the base is low. Both facts lead to an increased charge carrier transport by this permeable base. Due to the hetero-boundary surface between the base layer 6 and the selectively grown-in emitter layer 4, 5, the possibility derives of doping the base layer 6 arbitrarily high in an exemplary embodiment (far, far higher than $10^{19} cm^{-3}$) and of providing the base contacts as a low-impedance.

The transistor of the invention is likewise especially well-suited for power applications. Since the condition for constricting the emitter channel only defines the width of the emitter channel, the emitter length can be selected long. In a structure of the invention, however, the boundary surface between emitter and base, or the emitter-base capacitance, is thereby not significantly increased.

Although various minor changes and modifications might be proposed by those skilled in the art, it will be understood that we wish to include within the claims of the patent warranted hereon all such changes and modifications as reasonably come within our contribution to the art.

We claim:

1. A permeable base bipolar transistor, comprising:
   a substrate;
   a sub-collector layer grown on top of the substrate;
   a first conductivity type collector layer grown on top of the sub-collector layer;
   a second conductivity type base layer grown on top of the collector layer;
   a first conductivity type emitter layer grown onto the collector layer in an opening provided in said base layer;
   said emitter layer comprising a semiconductor material which has a greater energy bandgap than does a semiconductor material of said base layer;
   a base metallization on said base layer and an emitter metallization on said emitter layer which is electrically insulated from the base metallization; and a collector metallization on said sub-collector layer.

2. A transistor according to claim 1 wherein said emitter layer comprises a layer sequence comprising first and second layers, the first layer being grown immediately on the collector layer and having a greater energy bandgap than the second layer subsequently grown on the first layer.

3. A transistor according to claim 1 wherein said base layer comprises p+-GaAs and said emitter layer comprises a material system selected from the group consisting of N−-AlAs/N+-AlGaAs, N−-AlAs/N-AlGaAs/n+-GaAs, N−-AlAs/n-GaAs/n+-GaAs, N−-AlAs/n-GaAs/n+-grad.InGaAs/InGaAs, N−-AlGaAs/n+-GaAs, N−-AlGaAs/n−-GaAs/n+-GaAs, N-AlGaAs/n+-GaAs/n+-grad. InGaAs/InGaAs.

4. A transistor according to claim 1 wherein said base layer comprises p+-InGaAs and said emitter layer comprises n−-InP/n+-InP.

5. A transistor according to claim 1 wherein said base layer comprises p+-Ge and said emitter layer comprises N-GaAs.

6. A transistor according to claim 1 wherein said base layer comprises p+-SiGe and said emitter layer comprises n-Si/n+-Si.

7. A transistor according to claim 1 wherein said emitter layer comprises a plurality of strips proceeding parallel side-by-side and separated from one another by parts of said base layer.

8. A permeable base bipolar transistor, comprising:
a substrate;
a sub-collector layer grown on top of the substrate;
a first conductivity type collector layer grown on top of the sub-collector layer;
a second conductivity type base layer grown on top of the collector layer;
a first conductivity type emitter layer grown onto the collector layer through an opening provided in said base layer, said emitter layer terminating substantially at edges of said opening in the base layer;
said emitter layer comprising a semiconductor material which has a greater energy bandgap than does a semiconductor material of said base layer; and
electrical connections to said base, emitter, and sub-collector layers.

* * * * *